(12) United States Patent
Koyama et al.

(10) Patent No.: US 9,124,057 B2
(45) Date of Patent: Sep. 1, 2015

(54) MOUNTING COMPONENT, ELECTRONIC DEVICE, AND MOUNTING METHOD

(75) Inventors: Jiro Koyama, Otsu (JP); Hirotada Teranishi, Kusatsu (JP)

(73) Assignee: OMRON Corporation, Kyoto (JP)

( * ) Notice: Subject to any disclaimer, the term of this patent is extended or adjusted under 35 U.S.C. 154(b) by 756 days.

(21) Appl. No.: 13/016,203

(22) Filed: Jan. 28, 2011

(65) Prior Publication Data

US 2011/0201217 A1 Aug. 18, 2011

(30) Foreign Application Priority Data

Jan. 29, 2010 (JP) .................................. 2010-018657

(51) Int. Cl.
*H01R 12/00* (2006.01)
*H01R 43/02* (2006.01)
*H05K 3/34* (2006.01)

(52) U.S. Cl.
CPC .......... *H01R 43/0256* (2013.01); *H05K 3/3478* (2013.01); *H05K 3/3426* (2013.01); *H05K 2201/10984* (2013.01); *H05K 2203/0415* (2013.01); *Y10T 29/53174* (2015.01)

(58) Field of Classification Search
CPC .................................................. H01R 43/0256
USPC ...................................................... 439/83, 876
See application file for complete search history.

(56) References Cited

U.S. PATENT DOCUMENTS

| | | | |
|---|---|---|---|
| 5,411,236 A * | 5/1995 | Morita et al. ................. | 248/500 |
| 5,922,989 A | 7/1999 | Tsunoda et al. | |
| 6,570,280 B2 * | 5/2003 | Takahashi ....................... | 310/71 |
| 6,702,594 B2 * | 3/2004 | Lee et al. ......................... | 439/83 |
| 6,755,667 B2 * | 6/2004 | Lin ................................. | 439/83 |
| 7,147,489 B1 * | 12/2006 | Lin ................................. | 439/83 |
| 7,172,439 B1 * | 2/2007 | Yokobatake et al. ........... | 439/83 |
| 7,341,482 B2 * | 3/2008 | Ngo ............................... | 439/566 |
| 7,458,828 B2 * | 12/2008 | Pavlovic ........................ | 439/83 |
| 7,690,931 B2 * | 4/2010 | Lappohn ........................ | 439/83 |
| 7,828,562 B2 * | 11/2010 | Wu ................................. | 439/83 |
| 2004/0115998 A1 | 6/2004 | Shirae et al. | |
| 2005/0020146 A1 | 1/2005 | McAlonis et al. | |
| 2005/0064745 A1 * | 3/2005 | Zhang ............................ | 439/83 |
| 2007/0173137 A1 * | 7/2007 | Liao .............................. | 439/862 |
| 2010/0003868 A1 * | 1/2010 | Wu ................................ | 439/884 |
| 2011/0177725 A1 * | 7/2011 | Koyama et al. ............... | 439/759 |
| 2011/0177726 A1 * | 7/2011 | Koyama et al. ............... | 439/839 |

(Continued)

FOREIGN PATENT DOCUMENTS

CN 2660712 Y 12/2004
CN 1577996 A 2/2005

(Continued)

OTHER PUBLICATIONS

Korean Examination Report Issued in Application No. 10-2011-0006612, Dated Sep. 4, 2012 (9 Pages With English Trnaslation).

(Continued)

*Primary Examiner* — James Harvey
(74) *Attorney, Agent, or Firm* — Osha Liang LLP (57) ABSTRACT

A mounting component has a pad, a leg portion having a bottom surface thereof soldered to the pad, and an auxiliary hole made in a side face of the leg portion. The auxiliary hole is laterally opened so as not to be opened to the bottom surface. The auxiliary hole is operable to receive melted solder therein.

6 Claims, 8 Drawing Sheets

(56) References Cited

U.S. PATENT DOCUMENTS

| | | | |
|---|---|---|---|
| 2011/0189905 A1* | 8/2011 | Koyama et al. | 439/877 |
| 2011/0201217 A1* | 8/2011 | Koyama et al. | 439/83 |

FOREIGN PATENT DOCUMENTS

| | | |
|---|---|---|
| CN | 201018146 Y | 2/2008 |
| JP | S58129647 U | 9/1983 |
| JP | S60187557 U | 12/1985 |
| JP | H04-133490 A | 5/1992 |
| JP | H04-266005 A | 9/1992 |
| JP | 5-093029 A | 4/1993 |
| JP | H08-7390 A | 1/1996 |
| JP | 955570 A | 2/1997 |
| JP | 1041192 A | 2/1998 |
| JP | 2000-277376 A | 10/2000 |
| JP | 2002-334964 A | 11/2002 |
| JP | 2004-193055 A | 7/2004 |
| JP | 2004-311264 A | 11/2004 |
| JP | 2006-164682 A | 6/2006 |
| JP | 2007-200599 A | 8/2007 |
| JP | 2008-066199 A | 3/2008 |
| JP | 2008-166198 A | 7/2008 |
| JP | 2009049272 A | 3/2009 |
| JP | 2009-194118 A | 8/2009 |

OTHER PUBLICATIONS

Taiwan Examination Report Issued in Application No. 100102031, Dated Jun. 21, 2013 (11 Pages with English Translation).

Chinese Examination Report Issue in Application No. 201010602495.7, Dated Jun. 24, 2013 (16 Pages with English Translation).

Japanes Examination Report Issued in Application No. 2010-018657, Dated: Jul. 16, 2013 (7 Pages with English Translation).

Examination Report in counterpart Japanese Patent Application No. 2010-018657 dated Feb. 12, 2014 (5 pages).

\* cited by examiner

MOUNTING COMPONENT, ELECTRONIC DEVICE, AND MOUNTING METHOD

BACKGROUND OF THE INVENTION

1. Technical Field

The present invention relates to a mounting component, an electronic device, and a mounting method.

2. Related Art

In various mounting components such as a semiconductor element and a micro switch, a metallic leg portion is soldered to and mounted on a pad formed in a conductive pattern of a printed circuit board. Recently, due to miniaturization of a device, sizes of the leg portion of the mounting component and the pad of the conductive pattern are reduced, and array pitches of the leg portions and pads also become narrowed. Therefore, a bonding area between the leg portion and solder is reduced to cause mounting strength of the mounting component to become insufficient to the conductive pattern.

Particularly, in mounting components such as a micro switch and a connector, the higher mounting strength is required because a relatively large external force is applied to the soldered leg portion in use. In the mounting components such as the micro switch and the connector, frequently the soldered leg portion and a spring constituting a contact mechanism are integrally formed, and occasionally it is necessary that the leg portion be made of a material having not very high affinity with the solder, which results in peel-off of the solder.

The mounting strength is enhanced when the amount of solder used is increased to enlarge a wetted area. However, when the amount of solder is excessively increased, the solder runs over each pad, which results in the adjacent pad's short-circuit. When the solder is melted, a flux contained in the solder flows out to run up the leg portion. Therefore, in the mounting component such as the micro switch and the connector which is not completely molded, when the used amount of solder is increased, the flux invades into the mounting component to generate a trouble such as contact failure of the contact.

For example, as disclosed in FIG. 3 of Japanese Unexamined Patent Publication No. 2002-334964, in a technique of enhancing the mounting strength, the wetted area of the solder is enlarged to enhance the bonding strength by providing a vertical hole 6 or a groove 5. The vertical hole 6 or the groove 5 is opened to a bottom surface of a leg portion of a soldered lead 3, and sucks up the solder by capillarity. However, in the mounting component such as the micro switch and the connector to which a large external force is applied, joining strength between the leg portion and the solder is insufficient even if the vertical hole of Japanese Unexamined Patent Publication No. 2002-334964 is made.

Particularly, in a mounting structure of Japanese Unexamined Patent Publication No. 2002-334964, an inner circumferential surface of the vertical hole is perpendicular to a conductive pattern, and is extended in a direction identical to that of an outer circumferential surface of the leg portion.

Therefore, when a force is applied to the leg portion so as to perpendicularly tear off the leg portion from the conductive pattern, a shear force is applied among the inner circumferential surface of the vertical hole, the outer circumferential surface of the leg portion, and the solder to generate slip in a bonding surface, whereby frequently the leg portion is easily pulled out from the solder.

SUMMARY

One or more embodiments of the present invention provides a mounting component, an electronic device, and a mounting method having the high mounting strength of the soldering.

In accordance with one aspect of the present invention, there is provided a mounting component, wherein an auxiliary hole is made in a side face of a leg portion whose bottom surface is soldered to a pad, the auxiliary hole being laterally opened so as not to be opened to the bottom surface, the auxiliary hole receiving melted solder.

With this configuration, because the solder is also bonded to the inner surface of the auxiliary hole, the wetted area of the solder is enlarged in the leg portion to enhance bonding strength of the solder. Because the side face of the leg portion differs from the inner surface of the auxiliary hole in an orientation, the force orientations in which the pieces of solder are easily peeled off differ from each other. Therefore, the high mounting strength can be exerted irrespective of the direction of the external force. Additionally, because the solder acts as a hook that is latched in the auxiliary hole to prevent uplift of the leg portion, not only the peel-off strength of the solder but also a deformation bearing force of the solder contribute to the mounting strength.

In the mounting component according to one or more embodiments of the present invention, the auxiliary hole may penetrate through the leg portion.

With this configuration, because the pieces of solder on both sides of the leg portion are connected through the auxiliary hole, the solder enhances the mechanical strength as the hook latched in the leg portion.

In the mounting component according to one or more embodiments of the present invention, the plurality of auxiliary holes are made in the identical leg portion.

With this configuration, because the wetted area of the solder can further be enlarged, the mounting strength is further enhanced.

The mounting component according to one or more embodiments of the present invention may include a trap hole that is made in a position higher than the auxiliary hole to receive a flux of the solder.

With this configuration, the flux can be prevented from invading into the mounting component. Therefore, the amount of solder used can be increased by increasing a volume of the auxiliary hole.

In accordance with another aspect of the present invention, there is provided an electronic device, wherein any of the mounting components described above is soldered to a conductive pattern.

With this configuration, as described above, because of the high mounting strength of the mounting component, the breakdown caused by connection failure of the mounting component is hardly generated, and reliability of the electronic device is enhanced.

In accordance with still another aspect of the present invention, a component mounting method includes making an auxiliary hole in a side face of a leg portion of a mounting component whose bottom surface is soldered to a pad, the auxiliary hole being laterally opened so as not to be opened to the bottom surface, reflowing solder applied to one of the pad and the leg portion, and receiving the melted solder in the auxiliary hole.

With this configuration, because the solder is also bonded to the inner surface of the auxiliary hole, the wetted area of the solder is enlarged in the leg portion, the side face of the leg portion differs from the inner surface of the auxiliary hole in a force orientation in which the solder is easily peeled off, and the solder acts as a hook that is latched in the auxiliary hole to prevent uplift of the leg portion. Therefore, the mounting component has the high mounting strength.

DETAILED DESCRIPTION

Figure 1:
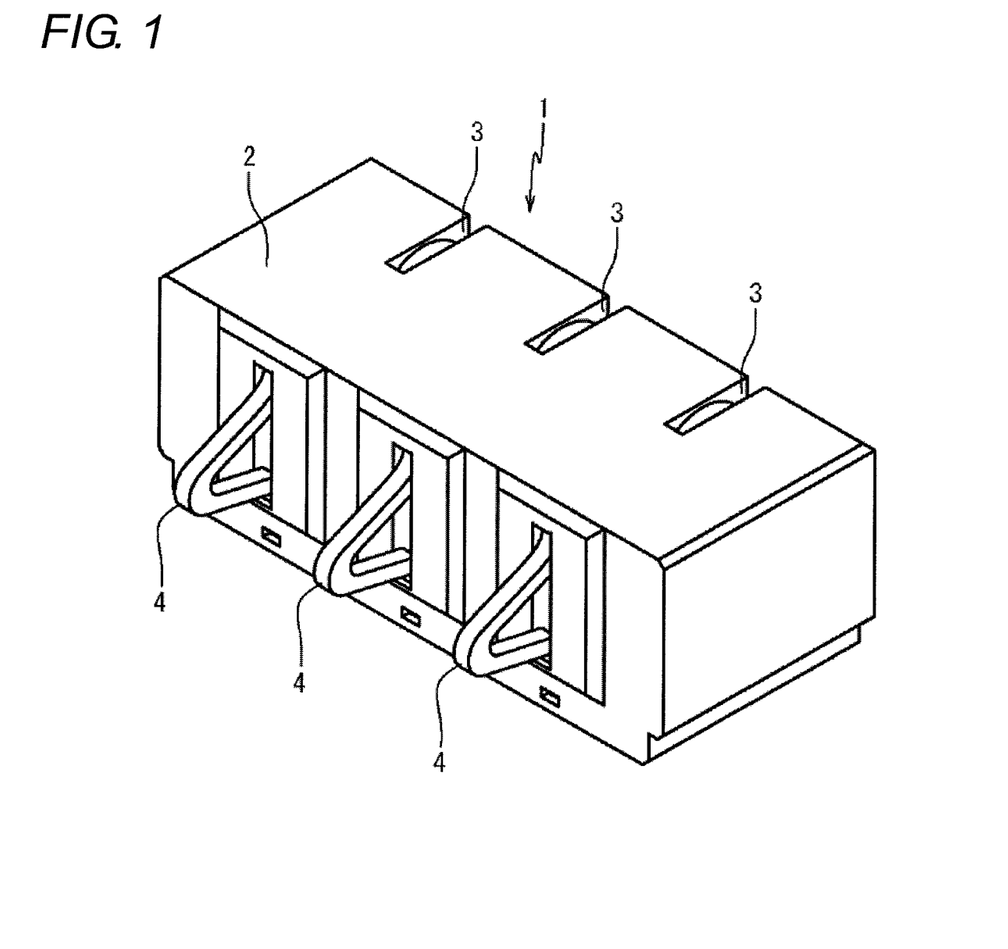
FIG. 1 is a perspective view illustrating an electric connector according to a first embodiment of the present invention.

Hereinafter, embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. FIG. 1 illustrates an electric connector 1 according to a first embodiment of the present invention. In the electric connector 1, contact members 4 are inserted in three slots 3 formed in a housing 2, respectively.

In the three contact members 4, the central contact member 4 is used as a control contact, and each of the contact members 4 located on both sides of the central contact member 4 is used as a contact that gets into touch with an electrode (the-other-end electrode) of a battery in order to supply a power. When the power supplying contact is formed by a pair of contacts formed by the two contact members 4, reliability of electrically-conductive touch with the-other-end electrode is further improved.

Figure 2:
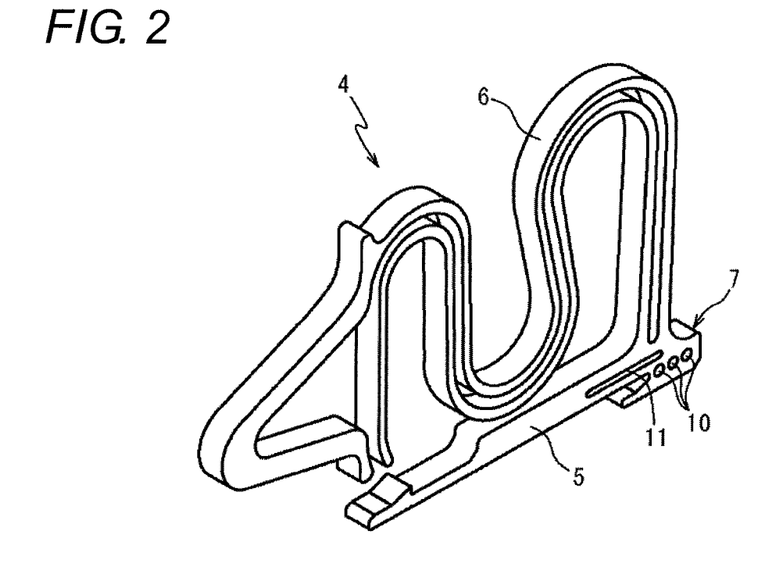
FIG. 2 is a perspective view illustrating a mounting state of the electric connector of FIG. 1.
Figure 3:
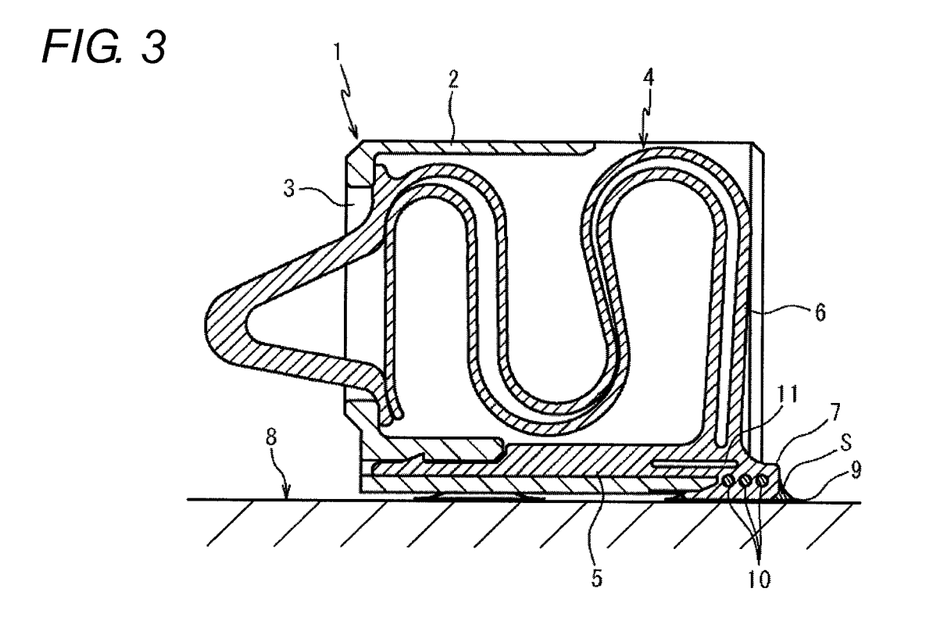
FIG. 3 is a sectional view illustrating a contact member of the electric connector of FIG. 1.

As illustrated in FIG. 2, the contact member 4 includes a fixed portion 5 that is fixed to the housing 2, a contact spring portion 6 that is extended from the fixed portion 5 while curved, and a leg portion 7 that is projected onto a rearward downside from the fixed portion 5 to an outside of the housing 2. As illustrated in FIG. 3, the fixed portion 5 is configured such that a leading end of the fixed portion 5 is press-fitted in the housing 2. A leading end of the contact spring portion 6 is projected forward from the housing 2, and the contact spring portion 6 constitutes a contact that can abut on the-other-end electrode. A bottom surface of the leg portion 7 is soldered to a printed board 8 to fix the electric connector 1 to the printed board 8, and the leg portion 7 constitutes an electrode that connects the contact member 4 onto a printed circuit of the printed board 8.

As illustrated in FIG. 3, the electric connector 1 is mounted on a circuit pattern of the printed board 8 by reflow of solder S. Particularly, the cream solder S is applied onto an electrode pad 9 formed in the printed board 8. The cream solder S is heated and melted (reflow) while the leg portion 7 is placed on the cream solder S, whereby the leg portion 7 is joined to the electrode pad 9 by the solder S. At this point, a surface tension of the melted solder S acts on the leg portion 7 so as to move the leg portion 7 to the center of the corresponding electrode pad 9.

Figure 4:
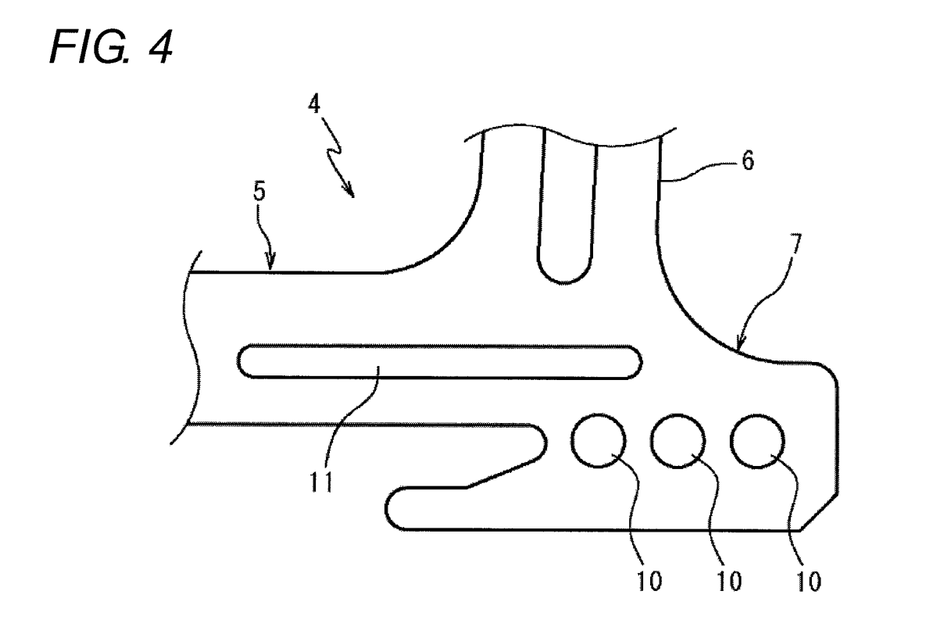
FIG. 4 is an enlarged side view illustrating a neighborhood of a leg portion of the electric connector of FIG. 1.

FIG. 4 illustrates the detailed leg portion 7. In the leg portion 7, three auxiliary holes 10 that are laterally opened are made in a side face. The auxiliary hole 10 penetrates horizontally through the leg portion 7 so as not to be opened to the bottom surface of the leg portion 7, and the auxiliary holes 10 is opened to both side faces of the leg portion 7. In the contact member 4, a groove-like trap hole 11 is made in a position higher than the auxiliary hole 10, and the trap hole 11 is horizontally extended to the fixed portion 5. The trap hole 11 is also formed so as to penetrate through the total width of the contact member 4.

Figure 5:
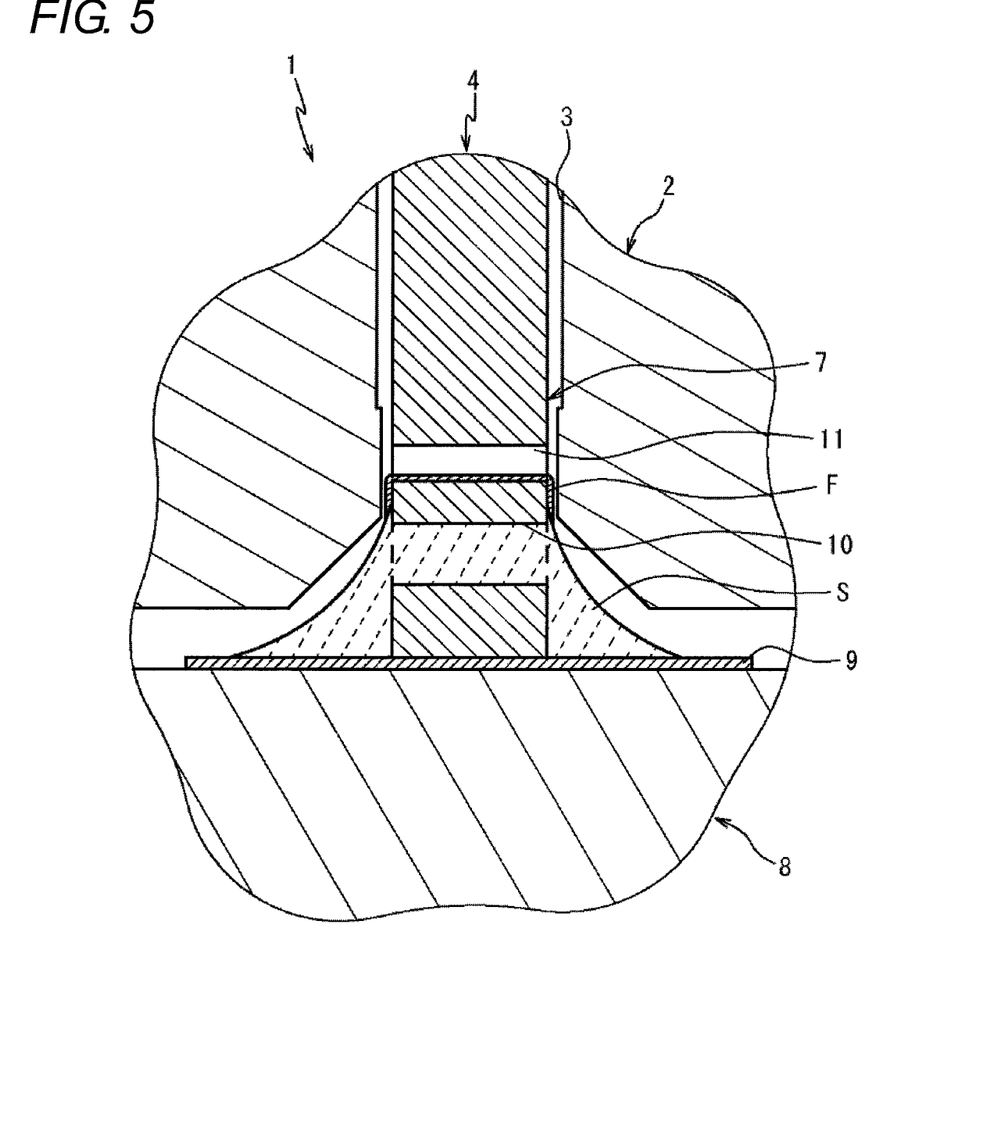
FIG. 5 is a sectional view illustrating the neighborhood of the leg portion in the mounting state of the electric connector of FIG. 1.

FIG. 5 illustrates a section of the electric connector 1 while the electric connector 1 is mounted on the printed board 8. The reflow solder S runs up the side faces on both sides of the leg portion 7 by wettability to invade into the auxiliary hole 10. As a result, as illustrated in FIG. 5, the pieces of solder S on both the sides of the leg portion 7 are connected through the auxiliary hole 10.

The auxiliary hole 10 enhances a joining force of the solder S because a wetted area is enlarged by the solder S of the leg portion 7. Because the side face of the leg portion 7 differs from the inner surface of the auxiliary hole 10 in an orientation, an external force cannot be applied so as to act on the solder S in a direction in which the whole of the solder S joined to the leg portion 7 is simultaneously torn off. For example, when the external force acts on the solder S in the direction in which the leg portion 7 is torn off from the printed board 8, the joined solder S is pressed against a surface on the downside of the auxiliary hole 10. Thus, the orientations of the surfaces to which the solder S is joined are diversified to be able to exert the high mounting strength to the external force in any direction.

Additionally the solder S acts as a hook that latches the auxiliary hole 10. Even if the whole of the contact member 4 is made of a material having low affinity with the solder S, because the solder S is extended into the auxiliary hole 10, the solder S can be peeled off from the leg portion 7 only by mechanically deforming and breaking the solder S firmly joined to the electrode pad 9. Therefore, the solder S is solidified while invading into the auxiliary hole 10, which allows enhancement of the mounting strength of the electric connector 1.

When the solder S is melted, a flux F of the solder S flows out to further run up the leg portion 7 by the wettability, and the flux F expands in directions of the fixed portion 5 and contact spring portion 6. At this point, the trap hole 11 receives the flux F such that the flux F does not run up the contact spring portion 6.

In the first embodiment, the three auxiliary holes 10 are made while horizontally arrayed. This is because surface areas of the three auxiliary holes 10 become larger than a surface of one large auxiliary hole to enlarge the wetted area. Because the auxiliary hole 10 and trap hole 11 having the complicated shapes are hardly formed in the extremely small leg portion 7, the reality is that the round or long hole is made like the first embodiment. However, when the auxiliary hole 10 and the trap hole 11 are made into the more complicated shapes, the wetted area of the solder S can be enlarged to further enhance the mounting strength, or the intake of the flux F can be promoted by the capillarity.

When the trap hole 11 is made long and thin like the first embodiment, the flux F is drawn by the capillarity so as not to invade into the electric connector 1. Possibly the flux F is solidified to obstruct an operation of another element of the electric connector 1 or to cause touch failure of the contact. However, the trouble caused by the flux F can be prevented by drawing the flux F in the trap hole 11.

Figure 6:
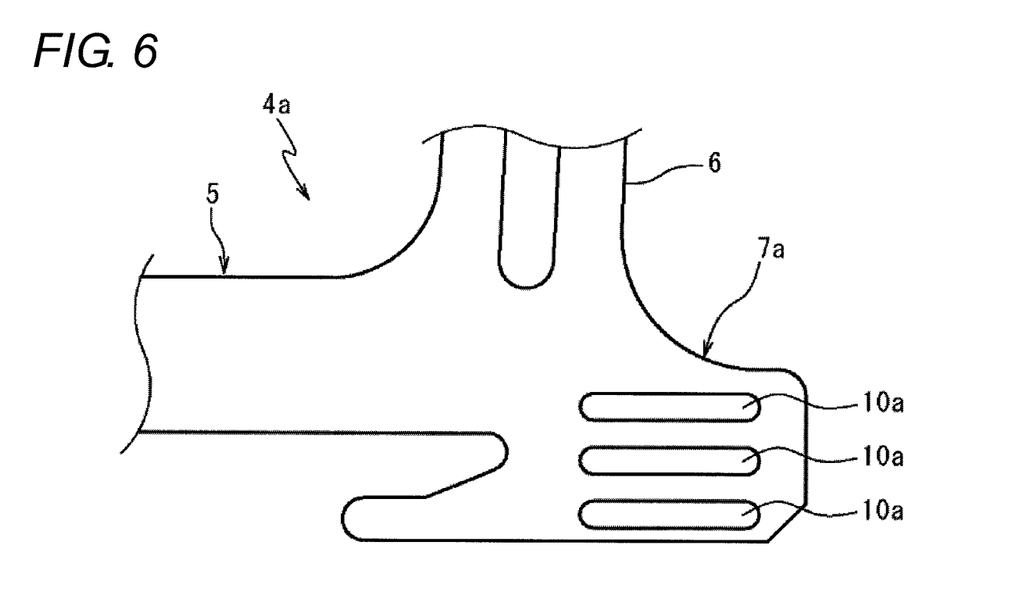
FIG. 6 is a side view illustrating a neighborhood of a leg portion of an electric connector according to a second embodiment of the present invention.

FIG. 6 illustrates a leg portion 7a of a contact member 4a of an electric connector according to a second embodiment of the present invention serving as the mounting component. In the following embodiments, the same elements as those of the first embodiment are designated by the same reference numerals, and the overlapping description is omitted.

Three horizontally slit-like auxiliary holes 10a are made in the leg portion 7 of the second embodiment while extended in parallel. In the second embodiment, not only the auxiliary holes 10a made on the upper side receive the solder to contribute to the enhancement of the mounting strength for the large amount of solder, but also the auxiliary holes 10a made on the upper side act as the trap hole in which the flux is taken for the small amount of solder.

Figure 7:
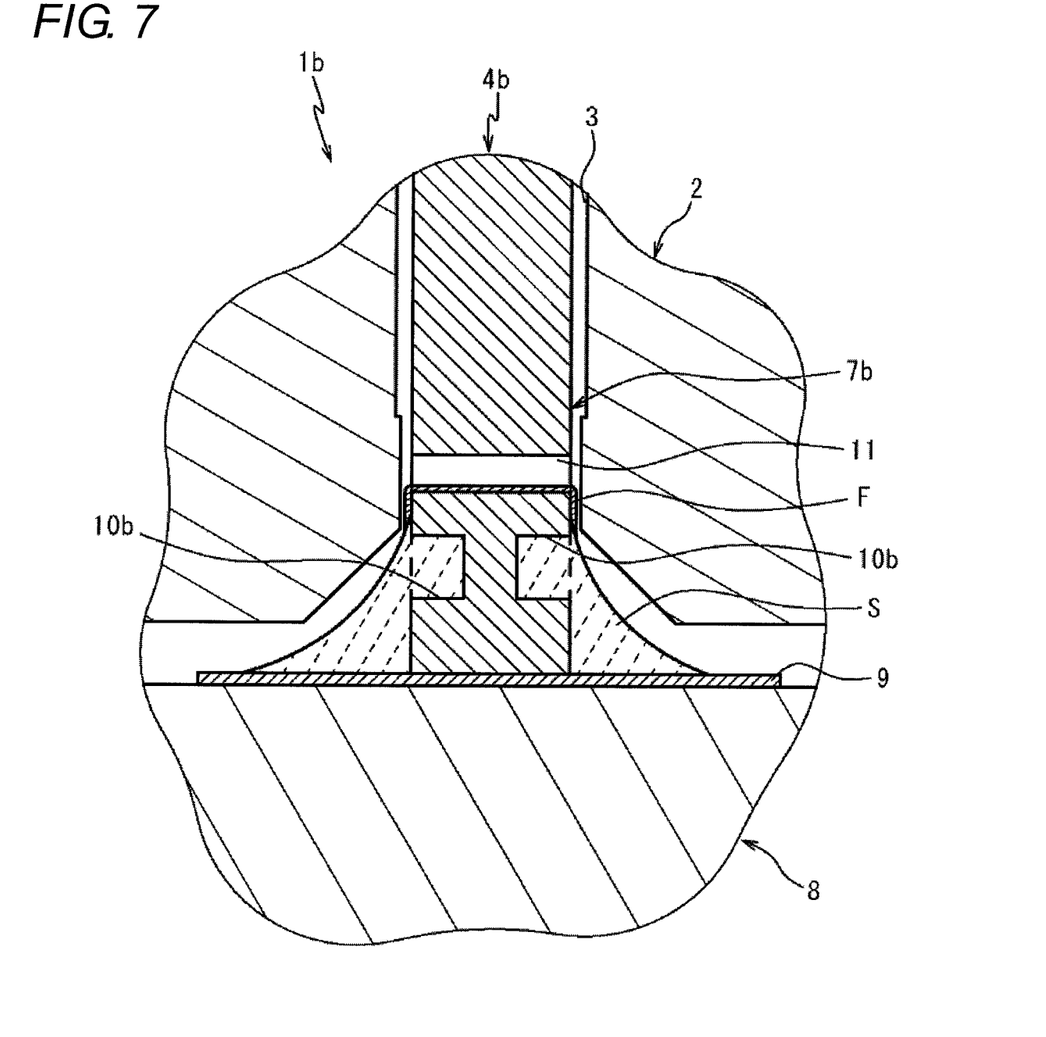
FIG. 7 is a sectional view illustrating a neighborhood of a leg portion in a mounting state of an electric connector according to a third embodiment of the present invention.

FIG. 7 illustrates a leg portion 7b of a contact member 4b of an electric connector 1b according to a third embodiment of the present invention serving as the mounting component. Auxiliary holes 10b constituting recesses are made in both side faces of the leg portion 7b of the third embodiment. Even in the auxiliary hole 10b, the bonding direction of the solder S is diversified while the wetted area of the solder S is enlarged, and the solder S having the hook shape is latched in the auxiliary hole 10b. Therefore, the mounting strength of the electric connector 1b is enhanced.

Figure 8:
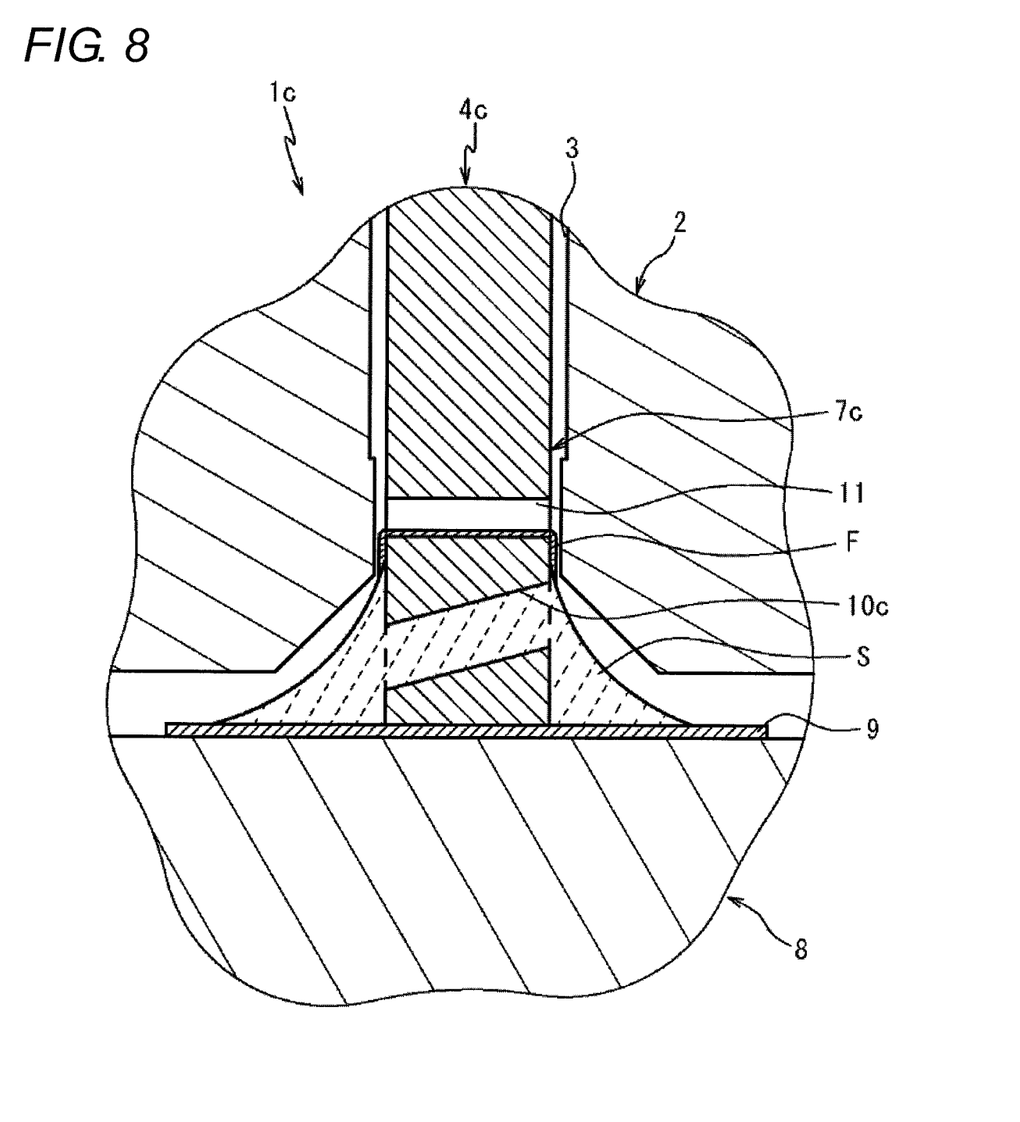
FIG. 8 is a sectional view illustrating a neighborhood of a leg portion in a mounting state of an electric connector according to a fourth embodiment of the present invention.

FIG. 8 illustrates a leg portion 7c of a contact member 4c of an electric connector 1c according to a fourth embodiment of the present invention serving as the mounting component. An auxiliary hole 10c that obliquely penetrates through the leg portion 7c from a side face on one side to a side face on the other side is made in the leg portion 7c of the fourth embodiment. As illustrated in FIG. 8, in one or more embodiments of the present invention, it is not always necessary that the auxiliary hole be parallel to the bottom surface of the leg portion.

However, the hole opened to the bottom surface of the leg portion, the bonding direction of the solder with respect to the inner circumferential surface of the hole does not largely differ from the bonding direction of the solder with respect to the side face of the leg portion. Therefore, the solder is easily sheared and peed off by the external force that tears off the leg portion from the conductive pattern, and the solder acts insufficiently as the hook. Therefore, the hole is not suitable for the auxiliary hole according to one or more embodiments of the present invention.

In the auxiliary hole of one or more embodiments of the present invention, the shape may vary in a depth direction. For example, when a hole is made into a conical shape whose diameter is decreased toward the depth side, the large wetted area of the solder is secured and the solder can be latched in the auxiliary hole as the hook. Therefore, the hole can be used as the auxiliary hole of one or more embodiments of the present invention.

Figure 9:
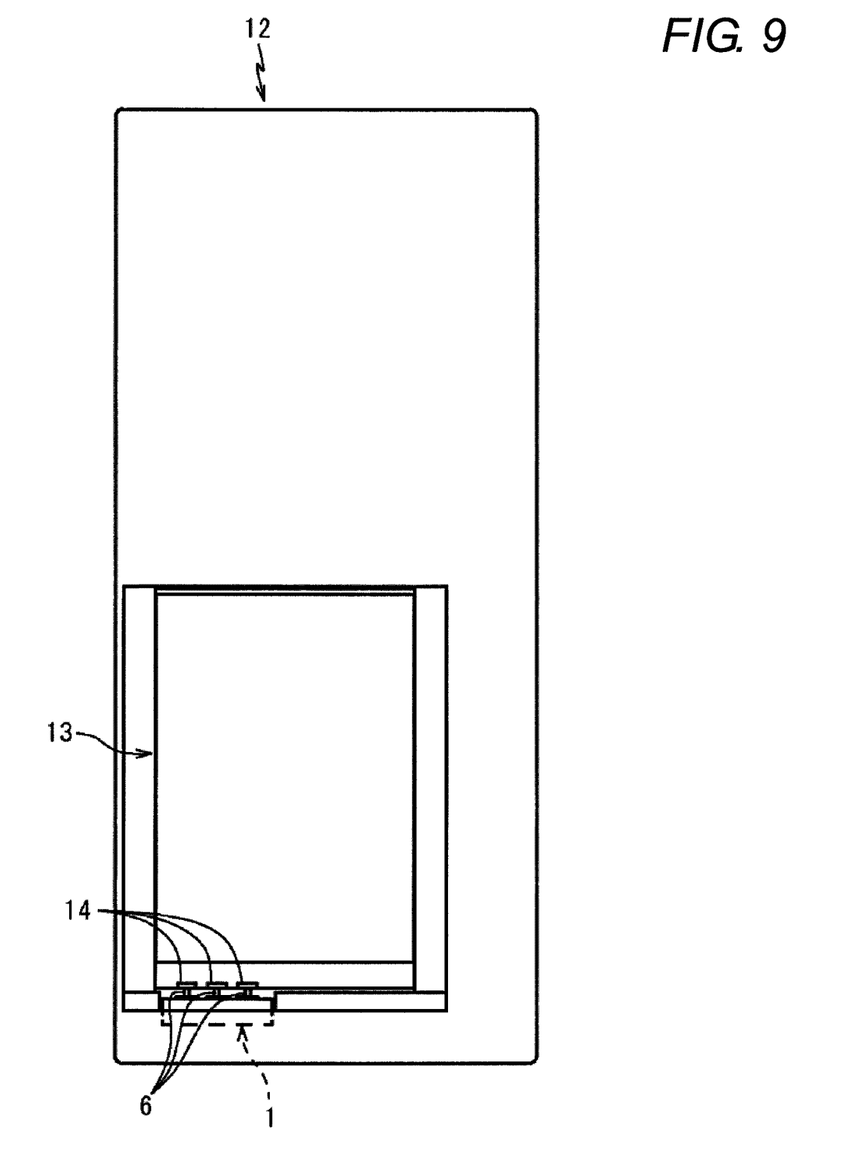
FIG. 9 is a rear view illustrating a mobile telephone according to an embodiment of the present invention on which the electric connector of FIG. 1 is mounted.

FIG. 9 illustrates a mobile telephone 12 as the electronic device according to an embodiment of the present invention provided with the electric connector 1 of the first embodiment. In the mobile telephone 12, the electric connector 1 is provided, and a battery 13 can be accommodated in a space adjacent to the electric connector 1. When the battery 13 is accommodated in the mobile telephone 12, the contact spring portion 6 of the electric connector 1 gets into pressure touch with an electrode 14 of the battery 13.

As described above, the electric connector 1 has the high mounting strength to the printed board 8, and the conductive connection defect caused by the peel-off of the solder S is hardly generated even if the contact pressure increased. Therefore, the electric power is always supplied from the battery 13 to the main body of the mobile telephone 12, so that standby processing and the like can securely be performed.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A mounting component, comprising:
   a pad;
   a leg portion having a bottom surface thereof soldered to the pad;
   a contact spring portion extending from the leg portion; and
   an auxiliary hole made in a side face of the leg portion,
   wherein the contact spring portion extends and bends in a contact spring plane,
   wherein the side face faces a direction perpendicular to the contact spring plane, and
   wherein the auxiliary hole is laterally opened so as not to be opened to the bottom surface, and the auxiliary hole is operable to receive melted solder therein.

2. The mounting component according to claim 1, wherein the auxiliary hole penetrates through the leg portion.

3. The mounting component according to claim 1, wherein a plurality of auxiliary holes are made in the leg portion.

4. A mounting component, comprising:
   a pad;
   a leg portion having a bottom surface thereof soldered to the pad;
   a contact spring portion extending from the leg portion; and
   an auxiliary hole made in a side face of the leg portion,
   wherein the contact spring portion extends and bends in a contact spring plane,
   wherein the side face faces a direction perpendicular to the contact spring plane, and
   wherein the auxiliary hole is laterally opened so as not to be opened to the bottom surface, and the auxiliary hole is operable to receive melted solder therein,
   wherein the mounting component further comprises a trap hole that is made in a position higher than the auxiliary hole to receive a flux of the solder.

5. An electronic device, wherein the mounting component according to claim 1 is soldered to a conductive pattern.

6. A component mounting method comprising:
   making an auxiliary hole in a side face of a leg portion of a mounting component, from which a contact spring portion extends, whose bottom surface is soldered to a pad, the auxiliary hole being laterally opened so as not to be opened to the bottom surface;
   reflowing solder applied to one of the pad and the leg portion; and
   receiving the melted solder in the auxiliary hole,
   wherein the contact spring portion extends and bends in a contact spring plane, and wherein the side face faces a direction perpendicular to the contact spring plane.

* * * * *